US012424476B2

(12) United States Patent
Horiuchi et al.

(10) Patent No.: US 12,424,476 B2
(45) Date of Patent: Sep. 23, 2025

(54) ELECTROSTATIC CHUCK, SUBSTRATE FIXING DEVICE AND PASTE

(71) Applicant: SHINKO ELECTRIC INDUSTRIES CO., LTD., Nagano (JP)

(72) Inventors: Michio Horiuchi, Nagano (JP); Ryosuke Hori, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 176 days.

(21) Appl. No.: 18/362,367

(22) Filed: Jul. 31, 2023

(65) Prior Publication Data

US 2024/0047259 A1 Feb. 8, 2024

(30) Foreign Application Priority Data

Aug. 2, 2022 (JP) .................. 2022-123355

(51) Int. Cl.
*H01T 23/00* (2006.01)
*H01J 37/32* (2006.01)
*H01L 21/683* (2006.01)

(52) U.S. Cl.
CPC .... *H01L 21/6833* (2013.01); *H01J 37/32715* (2013.01); *H01J 2237/2007* (2013.01)

(58) Field of Classification Search
None
See application file for complete search history.

(56) References Cited

U.S. PATENT DOCUMENTS

| | | | |
|---|---|---|---|
| 2008/0029032 A1* | 2/2008 | Sun | H01L 21/68757 156/914 |
| 2015/0223369 A1* | 8/2015 | Otsubo | H05K 9/0079 361/111 |
| 2016/0336210 A1* | 11/2016 | Cooke | H01L 21/67248 |
| 2020/0075383 A1 | 3/2020 | Minemura | |

FOREIGN PATENT DOCUMENTS

JP 2020-043336 A 3/2020

* cited by examiner

*Primary Examiner* — Stephen W Jackson
(74) *Attorney, Agent, or Firm* — Rankin, Hill & Clark LLP (57) ABSTRACT

An electrostatic chuck includes a base body, and an electrostatic electrode embedded in the base body. The base body is a ceramic. The electrostatic electrode has $Ti_xO_y$, which is an oxide of titanium, as a main component, and an atomic ratio y/x is less than 1.7.

11 Claims, 6 Drawing Sheets

ELECTROSTATIC CHUCK, SUBSTRATE FIXING DEVICE AND PASTE

CROSS-REFERENCE TO RELATED APPLICATIONS

This application claims priority from Japanese Patent Application No. 2022-123355, filed on Aug. 2, 2022, the entire content of which is incorporated herein by reference.

TECHNICAL FIELD

The present invention relates to an electrostatic chuck, a substrate fixing device and a paste.

BACKGROUND ART

In the related art, a film formation apparatus and a plasma etching apparatus that are used when manufacturing a semiconductor device each have a stage for accurately holding a wafer in a vacuum treatment chamber. As such a stage, for example, suggested is a substrate fixing device that adsorbs and holds a wafer by an electrostatic chuck mounted on a base plate, for example.

The electrostatic chuck includes a base body, an electrostatic electrode embedded in the base body, and the like. The base body is, for example, a high-purity alumina ceramic, and the electrostatic electrode is, for example, a sintered body having tungsten as a main component and including nickel oxide, aluminum oxide, and silicon dioxide.

In the sintered body described above, ceramic and tungsten are sintered under the same conditions. However, since tungsten has a high melting point (3300° C. or higher), it is difficult to sinter the same, and therefore, it is needed to add an appropriate sintering aid. In the sintered body described above, nickel oxide, aluminum oxide, and silicon dioxide function as sintering aids. By using such a sintering aid, an electrostatic chuck with high adhesion between the base body and the electrostatic electrode is realized (for example, refer to Patent Literature 1).

CITATION LIST

Patent Literature

Patent Literature 1: JP2020-43336A

SUMMARY OF INVENTION

However, depending on materials of the base body, when a sintering aid is added to tungsten, a component of the sintering aid diffuses to the ceramic side, and accordingly, the insulation resistivity may decrease. On the other hand, if the sintering aid is not added to tungsten, sintering of tungsten does not proceed and adhesion between the base body and the electrostatic electrode is not obtained.

The present invention has been made in view of the above situations, and an object thereof is to provide an electrostatic chuck with high adhesion between a base body and an electrostatic electrode, in which a material in place of tungsten is used for the electrostatic electrode.

According to an aspect of the present disclosure, there is provided an electrostatic chuck including a base body, and an electrostatic electrode embedded in the base body. The base body is a ceramic. The electrostatic electrode has $Ti_xO_y$, which is an oxide of titanium, as a main component, and an atomic ratio y/x is less than 1.7.

According to the disclosed technology, it is possible to provide the electrostatic chuck with high adhesion between the base body and the electrostatic electrode, in which the material in place of tungsten is used for the electrostatic electrode.

DESCRIPTION OF EMBODIMENTS

Hereinafter, embodiments of the present invention will be described with reference to the drawings. Note that, in the respective drawings, the parts having the same configurations are denoted with the same reference signs, and the overlapping descriptions may be omitted.

[Structure of Substrate Fixing Device]

Figure 1:
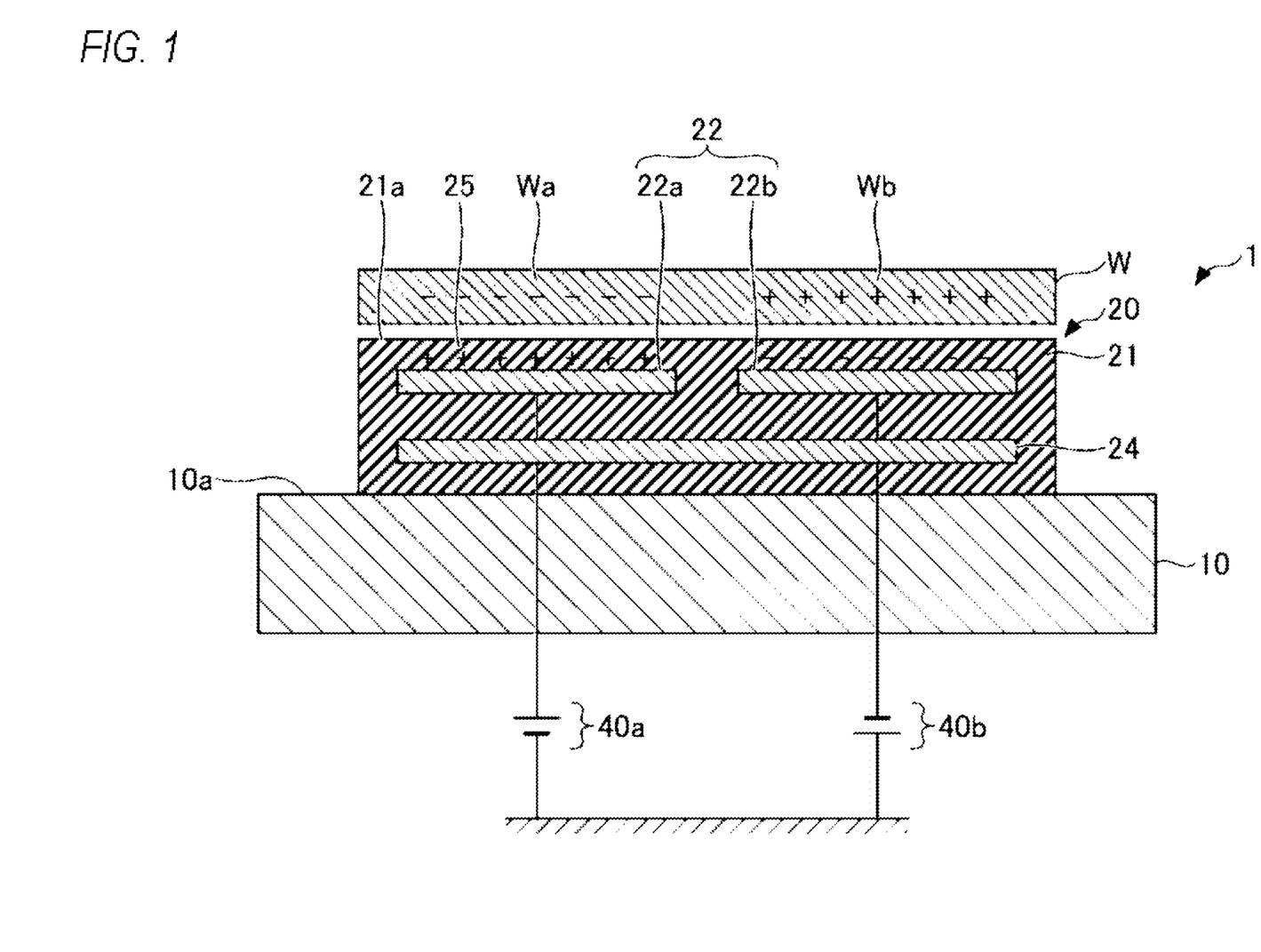
FIG. 1 is a cross-sectional view simplifying and exemplifying a substrate fixing device according to the present embodiment.

FIG. 1 is a cross-sectional view simplifying and exemplifying a substrate fixing device according to the present embodiment. Referring to FIG. 1, a substrate fixing device 1 has, main constitutional elements, a base plate 10, and an electrostatic chuck 20. The substrate fixing device 1 is a device that adsorbs and holds a substrate W (for example, a semiconductor wafer, or the like), which is a target object to be adsorbed, by the electrostatic chuck 20.

The base plate 10 is a member for mounting the electrostatic chuck 20. A thickness of the base plate 10 is, for example, about 20 to 40 mm. The base plate 10 is formed of, for example, a metal material such as aluminum and cemented carbide, a composite material of the metal material and a ceramic material, or the like, and may be used as an electrode or the like for controlling plasma. For example, from standpoints of easy availability, easy processing, favorable thermal conductivity and the like, aluminum or an alloy thereof is used, and the material whose surface has been subjected to an alumite treatment (insulation layer formation) may be favorably used.

For example, by supplying predetermined high-frequency electrical power to the base plate 10, the energy for causing ions and the like in a generated plasma state to collide with the substrate W adsorbed on the electrostatic chuck 20 can be controlled to effectively perform etching processing.

The base plate 10 may be provided therein with a gas supply path for introducing an inert gas for cooling the substrate W adsorbed on the electrostatic chuck 20. When an inert gas such as He or Ar is introduced into the gas supply path from an outside of the substrate fixing device 1 and the inert gas is supplied to a back surface of the substrate W adsorbed on the electrostatic chuck 20, the substrate W can be cooled.

The base plate 10 may be provided therein with a refrigerant flow path. The refrigerant flow path is, for example, a hole formed in an annular shape in the base plate 10. For example, refrigerant such as cooling water and GALDEN is introduced into the refrigerant flow path from an outside of the substrate fixing device 1. By circulating the refrigerant in the refrigerant flow path to cool the base plate 10, it is possible to cool the substrate W adsorbed on the electrostatic chuck 20.

The electrostatic chuck 20 is a part that adsorbs and holds the substrate W that is a target object to be adsorbed. A planar shape of the electrostatic chuck 20 is formed according to a shape of the substrate W, and is circular, for example. A diameter of the wafer that is a target object to be adsorbed of the electrostatic chuck 20, is, for example, 8 inches, 12 inches or 18 inches.

Note that the description 'in a plan view' indicates that a target object is seen from a normal direction of an upper surface 10a of the base plate 10, and the description 'planar shape' indicates a shape of the target object as seen from the normal direction of the upper surface 10a of the base plate 10.

The electrostatic chuck 20 is provided on the upper surface 10a of the base plate 10 via an adhesive layer. The adhesive layer is, for example, a silicone-based adhesive. A thickness of the adhesive layer is, for example, about 0.1 to 2.0 mm. The adhesive layer has effects of bonding the base plate 10 and the electrostatic chuck 20 and reducing stress that is caused due to a difference in thermal expansion coefficient between the ceramic electrostatic chuck 20 and the aluminum base plate 10. Note that the electrostatic chuck 20 may also be fixed to the base plate 10 by screws.

The electrostatic chuck 20 is a ceramic substrate having, as main constitutional elements, a base body 21, an electrostatic electrode 22, and a heat-generating element 24. An upper surface of the base body 21 is a placement surface 21a on which a target object to be adsorbed is placed. The electrostatic chuck 20 is, for example, a Coulomb force type electrostatic chuck.

The base body 21 is a dielectric body. A thickness of the base layer 21 is, for example, about 5 to 10 mm. A relative permittivity (1 kHz) of the base body 21 is, for example, about 9 to 10. The base body 21 preferably has an insulation resistivity of $10^{14}$ Ωcm or higher at 300° C.

The base body 21 is a ceramic made of, for example, aluminum oxide ($Al_2O_3$), yttrium aluminum garnet (YAG), or the like, as a main component.

The base body 21 is preferably an aluminum oxide ceramic containing 10 mol % or more and 80 mol % or less of an yttrium aluminum garnet phase (YAG phase). Thereby, the insulation resistivity of the base body 21 at 300° C. can be $10^{14}$ Ωcm or higher.

The base body 21 may also be an aluminum oxide ceramic having an aluminum oxide purity of 99 wt. % or higher. Thereby, the insulation resistivity of the base body 21 at 300° C. can be $10^{14}$ Ωcm or higher. Note that the purity of 99% or higher indicates that a sintering aid is not added. In addition, the purity of 99% or higher means that unintended impurities may be included during a manufacturing process and the like. The base body 21 preferably has a relative density of 97% or greater with respect to the aluminum oxide. In the base body 21, it is preferable that an average particle diameter of aluminum oxide is 1.0 μm or less in order to improve sinterability.

The electrostatic electrode 22 is a thin film electrode formed by an electric conductor pattern, and is embedded in the base body 21. In the present embodiment, the electrostatic electrode 22 is a double-electrode type, and has a first electrostatic electrode 22a and a second electrostatic electrode 22b. Note that, as the electrostatic electrode 22, a single-electrode type consisting of one electrostatic electrode may also be used.

The electrostatic electrode 22 has $Ti_xO_y$ (atomic ratio y/x is less than 1.7), which is an oxide of titanium, as a main component. Here, the main component means a component that accounts for 80 wt % or more of total materials constituting the electrostatic electrode 22. The electrostatic electrode 22 is preferably composed of only $Ti_xO_y$ (atomic ratio y/x is less than 1.7), which is an oxide of titanium, or only one or more of $Ti_xO_y$ (atomic ratio y/x is less than 1.7), which is an oxide of titanium, and an oxynitride of titanium. $Ti_xO_y$ (atomic ratio y/x is less than 1.7), which is an oxide of titanium, is, for example, $Ti_3O_5$, but is not limited thereto. In addition, the oxynitride of titanium is, for example, $TiO_{0.34}N_{0.74}$, but is not limited thereto.

When the electrostatic electrode 22 has $Ti_xO_y$ (atomic ratio y/x is less than 1.7), which is an oxide of titanium, as a main component, adhesion with the base body 21 can be secured even if a paste to become the electrostatic electrode 22 is fired without using a sintering aid. In addition, since no sintering aid is used, a component of the sintering aid does not diffuse toward the base body 21 side, so the base body 21 can maintain a high insulation resistivity. The base body 21 exhibiting such effects includes the aluminum oxide ceramic containing at least 10 mol % or more and 80 mol % or less of the YAG phase, and the aluminum oxide ceramic having an aluminum oxide purity of 99 wt % or higher.

In this way, in the electrostatic chuck 20, the electrode can be formed even without tungsten, which is a metal of high industrial and military importance and is also an element with low concentration in the Earth's crust, unevenly distributed in terms of production areas, and designated as a conflict mineral. In addition, since a sintering aid such as $SiO_2$, which is likely to diffuse into a ceramic containing, especially, $Y_2O_3$, and to deteriorate properties, is not used, a component of the sintering aid does not diffuse toward the base body 21 side.

The first electrostatic electrode 22a is connected to a positive electrode side of a power supply 40a provided outside the substrate fixing device 1. In addition, the second electrostatic electrode 22b is connected to a negative electrode side of a power supply 40b provided outside the substrate fixing device 1. A negative electrode side of the power supply 40a and a positive electrode side of the power supply 40b are connected outside the substrate fixing device 1, and a connection point becomes a ground potential.

A positive (+) voltage is applied to the first electrostatic electrode 22a from the power supply 40a, and a negative (−) voltage is applied to the second electrostatic electrode 22b from the power supply 40b. Thereby, positive (+) charges are charged on the first electrostatic electrode 22a and negative (−) charges are charged on the second electrostatic electrode 22b. Along with this, negative (−) charges are induced in a part Wa of the substrate W corresponding to the first electrostatic electrode 22a, and positive (+) charges are induced in a part Wb of the substrate W corresponding to the second electrostatic electrode 22b.

When the substrate W, the electrostatic electrode 22 and a ceramic part 25 of the electrostatic chuck 20 (base body 21) arranged therebetween are regarded as capacitors, the ceramic part 25 corresponds to a dielectric layer. Then, the substrate W is electrostatically adsorbed on the electrostatic chuck 20 by a Coulomb's force generated between the electrostatic electrode 22 and the substrate W via the ceramic part 25. The higher the voltage applied to the electrostatic electrode 22 is, the stronger the adsorption holding force is.

The heat-generating element 24 is a heater that is embedded in the base body 21 and generates heat as a current flows therethrough, thereby heating the placement surface 21a of the base body 21 to a predetermined temperature. The heat-generating element 24 is arranged on a lower side (base plate 10 side) of the first electrostatic electrode 22a and the second electrostatic electrode 22b. The heat-generating element 24 is an electrical conductor formed into a film shape. The heat-generating element 24 is provided as a plurality of heater electrodes capable of independently heating and controlling a plurality of regions (heater zones) in a plane of the base body 21. Note that the heat-generating element 24 may also be provided as one heater electrode. As the material of the heat-generating element 24, a material similar to that of the electrostatic electrode 22 can be used, for example.

When current is supplied to the heat-generating element 24 from a power supply provided outside the substrate fixing device 1, the heat-generating element 24 generates heat, and therefore, the electrostatic chuck 20 is heated. The substrate W is controlled to a predetermined temperature by the temperature of the electrostatic chuck 20. The heating temperature of the electrostatic chuck 20 is set within the range of 50° C. to 200° C., for example, to 150° C.

Figure 2:
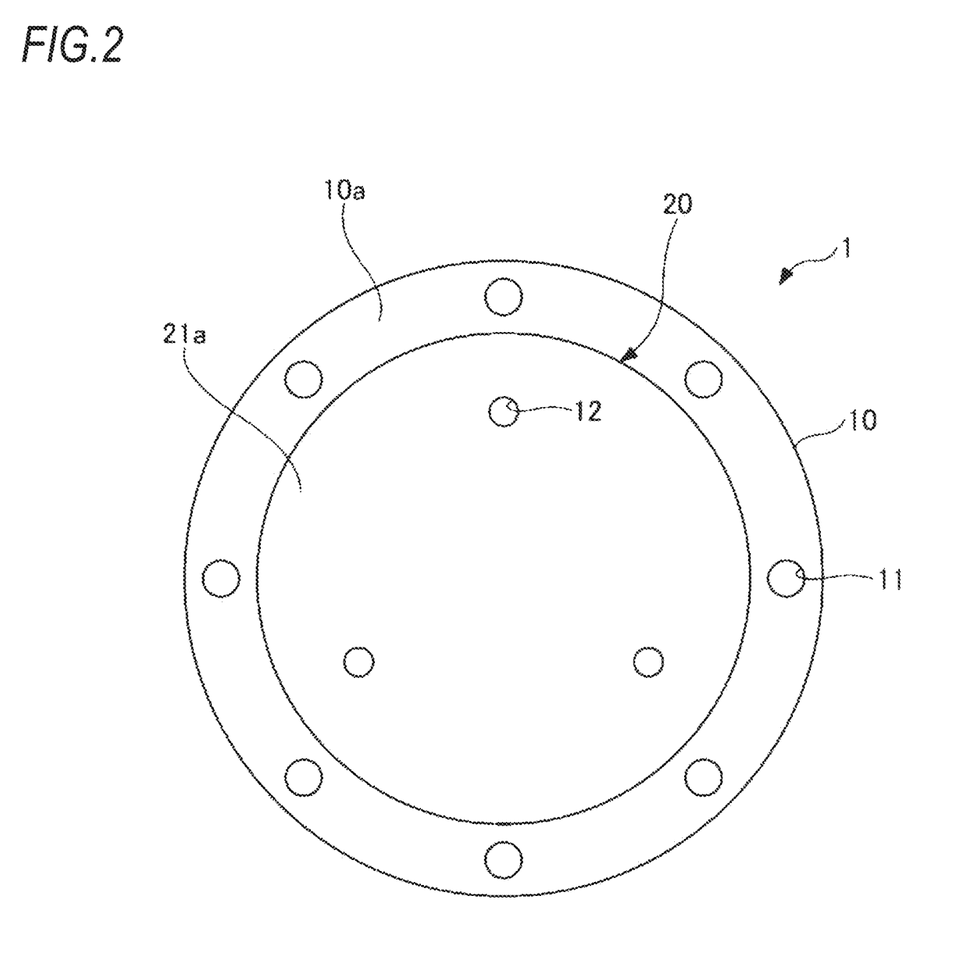
FIG. 2 is a plan view simplifying and exemplifying the substrate fixing device according to the first embodiment.

FIG. 2 is a plan view simplifying and exemplifying a substrate fixing device according to the present embodiment. Referring to FIG. 2, in the substrate fixing device 1, the electrostatic chuck 20 is arranged on the disk-shaped base plate 10, and a peripheral edge portion of the base plate 10 is exposed around the electrostatic chuck 20. Attachment holes 11 for attaching the substrate fixing device to a chamber of a semiconductor manufacturing apparatus are formed in the peripheral edge portion of the base plate 10 to be aligned along the peripheral edge portion.

In addition, each of the electrostatic chuck 20 and the base plate 10 has a plurality of (three, in FIG. 2) opening portions 12 for lift pins in a central portion thereof. Lift pins for moving the substrate W in an upper and lower direction are inserted into the opening portions 12 for lift pins. When the substrate W is moved up from the placement surface 21a by the lift pins, the substrate W can be automatically conveyed by a conveyor device.

[Method for Manufacturing Electrostatic Chuck]

Next, a method for manufacturing the electrostatic chuck 20 will be described. FIGS. 3A, 3B, 3C, 4A, 4B and 4C are perspective views exemplifying processes of manufacturing the electrostatic chuck according to the present embodiment.

Figure 3A:
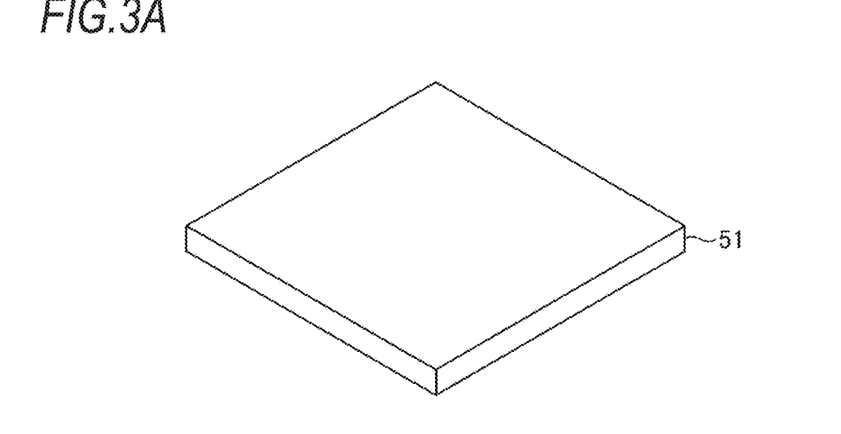
FIGS. 3A, 3B, 3C are perspective views (part 1) exemplifying a process of manufacturing an electrostatic chuck according to the present embodiment.

First, as shown in FIG. 3A, a green sheet 51 made of a ceramic material and an organic material is prepared. The green sheet 51 is formed into a shape of a rectangular plate, for example. The ceramic material of the green sheet 51 is, for example, an aluminum oxide ceramic containing 10 mol % or more and 80 mol % or less of the YAG phase, or an aluminum oxide ceramic having an aluminum oxide purity of 99 wt % or higher. The ceramic material of the green sheet 51 does not include a sintering aid. The organic component is removed from the green sheet 51, and the ceramic material is sintered and densified, so that the green sheet 51 becomes the base body 21 of a part where the substrate W shown in FIG. 1 is mounted.

Figure 3B:
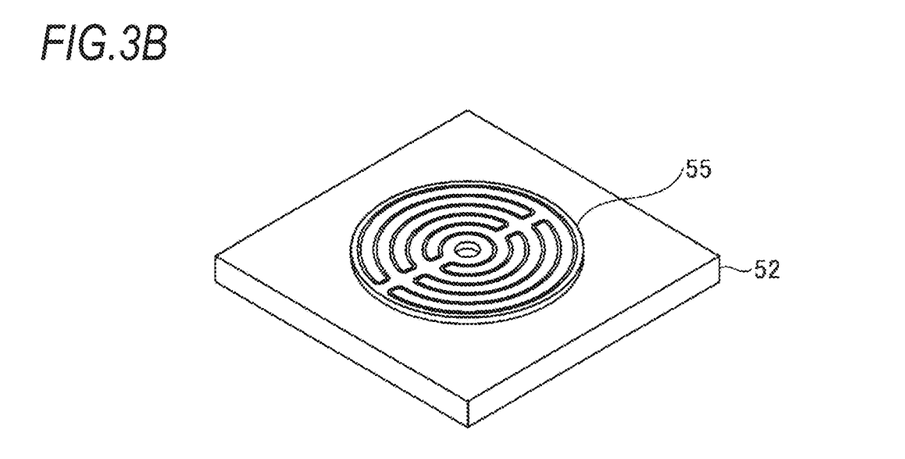

Next, as shown in FIG. 3B, a green sheet 52 made of a similar material and having a similar shape to those of the green sheet 51 is prepared, and an electrically conductive paste is printed on an upper surface of the green sheet 52 by, for example, a printing method (screen printing), thereby forming an electrical conductor pattern 55. The electrical conductor pattern 55 is fired in a process described below to be the electrostatic electrode 22 shown in FIG. 1. Note that the electrical conductor pattern 55 may also be formed on a lower surface of the green sheet 51.

As the paste for forming the electrical conductor pattern 55, for example, a paste containing titanium dioxide powder and carbon powder may be used. This paste preferably contains titanium dioxide powder and carbon powder so that an amount of carbon powder relative to an amount of titanium dioxide powder is within a range of 1.8 or more and 2.2 or less in terms of a molar ratio. By using such a paste, when the electrical conductor pattern 55 is sintered in a later process, the electrostatic electrode 22 having $Ti_xO_y$ (atomic ratio y/x is less than 1.7), which is an oxide of titanium, as a main component, is obtained.

Figure 3C:
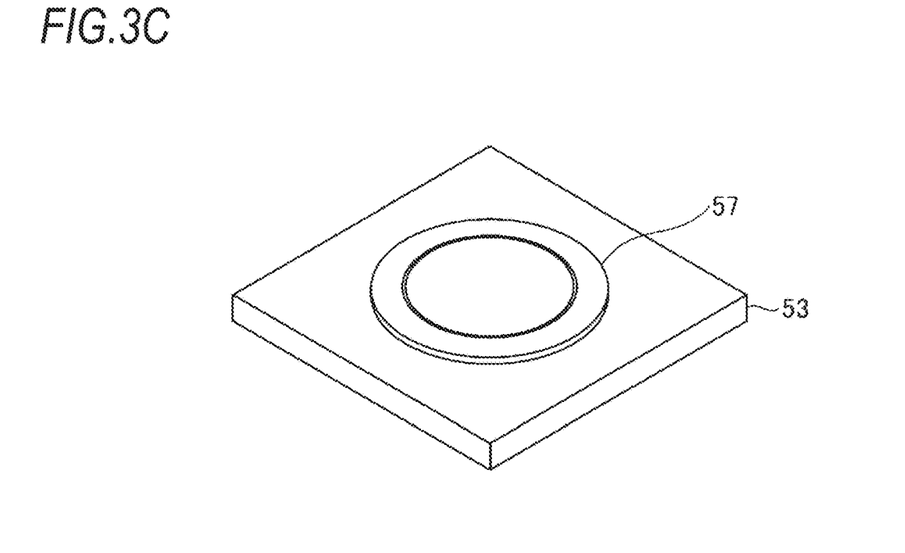

Next, as shown in FIG. 3C, a green sheet 53 made of a similar material and having a similar shape to those of the green sheet 51 is prepared, and an electrically conductive paste is printed on an upper surface of the green sheet 53 by, for example, a printing method (screen printing), thereby forming an electrical conductor pattern 57. For the electrically conductive paste for forming the electrical conductor pattern 57, an electrically conductive paste made of the same material as the electrically conductive paste for forming the electrical conductor pattern 55 described above may be used. The green sheet 53 is for forming the heat-generating element 24 shown in FIG. 1 by being fired, and becomes the base body 21 of a part to be bonded to the base plate 10. The electrical conductor pattern 57 is fired in a process described later to be the heat-generating element 24. Note that the electrical conductor pattern 57 may also be formed on a lower surface of the green sheet 52.

Figure 4A:
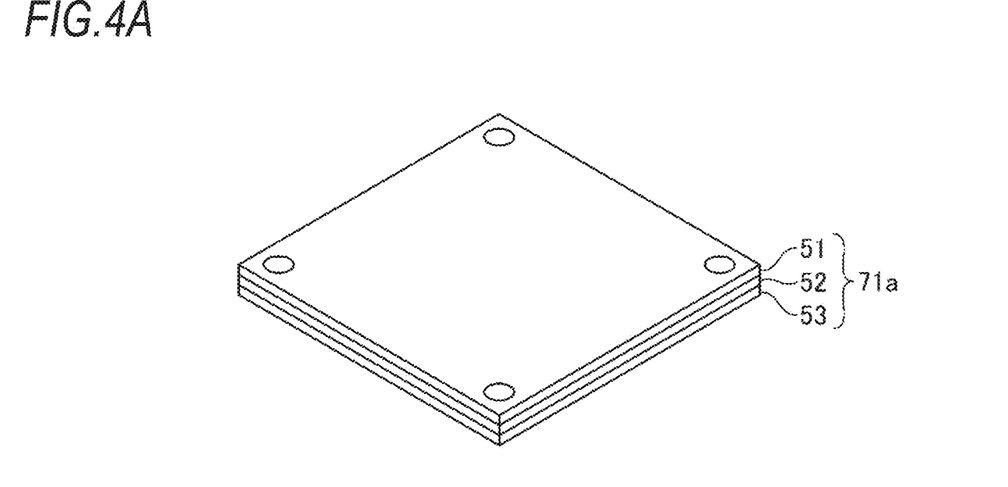
FIGS. 4A, 4B, 4C are perspective views (part 2) exemplifying the process of manufacturing the electrostatic chuck according to the present embodiment.

Next, as shown in FIG. 4A, each of the green sheets 51 to 53 is laminated to form a structure 71a. The green sheets 51 to 53 are bonded to one another by pressurizing the green sheets while heating the same. Next, as shown in FIG. 4B, a periphery of the structure 71a is cut to form a disk-shaped structure 71b.

Figure 4B:
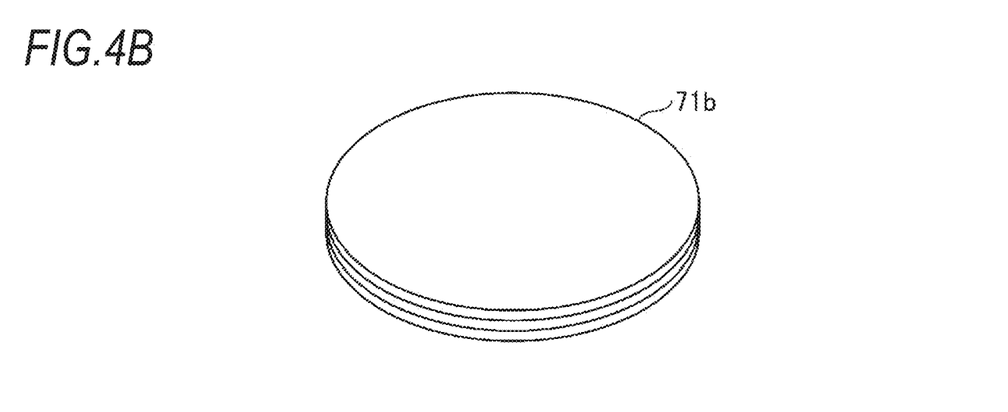
Figure 4C:
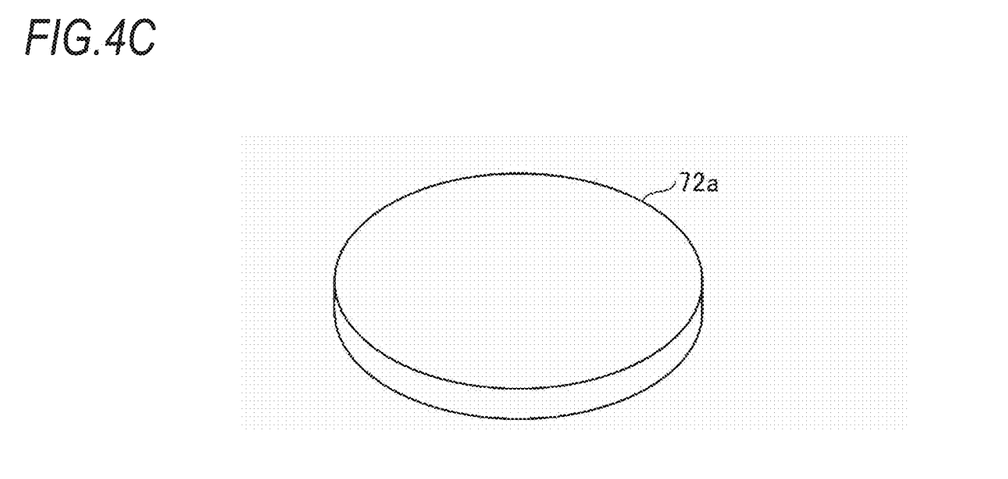

Next, the structure 71b shown in FIG. 4B is fired to obtain a ceramic substrate 72a shown in FIG. 4C. The temperature at the time of firing is, for example, 1600° C. In this process, by sintering the electrical conductor pattern 55, the electrostatic electrode 22 having $Ti_xO_y$ (atomic ratio y/x is less than 1.7), which is an oxide of titanium, as a main component, is obtained. In addition, the heat-generating element 24 is obtained by sintering the electrical conductor pattern 57.

Next, various processing is performed on the ceramic substrate 72a to complete the electrostatic chuck 20. For example, the upper and lower surfaces of the ceramic substrate 72a are polished to form a placement surface and an adhesive surface. Further, the opening portions 12 for lift pins shown in FIG. 1 are formed in the ceramic substrate 72a.

Below, the present invention will be described in more detail with reference to Examples, but the present invention is not limited to the Examples at all.

EXAMPLES

Titanium dioxide ($TiO_2$) powder and carbon (C: graphite) powder were mixed with a molar ratio of 1:2, and kneaded with a commercially available vehicle containing ethyl cellulose and terpineol as main components to prepare a paste for electrode formation.

On the other hand, a slurry was prepared by a ball milling method in which polyvinyl butyral and dibutyl phthalate as main organic components were added to an inorganic powder mixture containing 10 mol % of $Y_2O_3$ (purity: 99.99 wt %) and aluminum oxide (purity: 99.99 wt %) as the balance, and an organic solvent was used, and a green sheet was prepared by a doctor blade method.

Next, after punching the green sheet into a specific shape, two layers were made into a laminate by a heating and pressing method. A mask was formed on the laminate by using an adhesive tape, and the paste for electrode formation described above was applied by a simple squeegee method to obtain a test sample.

Figure 5A:
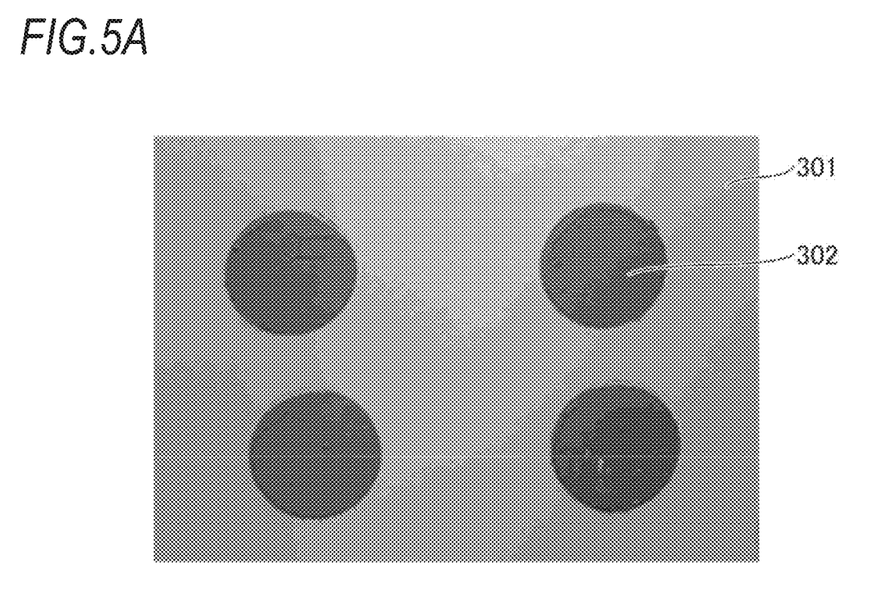
FIGS. 5A and 5B are photographs showing an appearance of a test sample prepared in Example.

Next, the test sample was subjected to a heat treatment at 400° C. in an air atmosphere to remove organic components. In this way, since the air atmosphere can be used as the degreasing atmosphere, degreasing is easy, and the influence of residual organic matters during firing can be excluded. As shown in FIG. 5A, in the appearance of the degreased body, the green sheet part (indicated by 301 in the drawing) was completely white, which was clearly different from the black gray of the degreased body treated in the neutral atmosphere ($N_2$ or $N_2+H_2O$) that is adopted in the case of including a tungsten paste layer.

On the other hand, the applied part of the paste for electrode formation (indicated by 302 in the drawing) was black-gray, and no abnormality such as swelling was observed. The change in weight of the undried graphite powder, which was placed in a crucible and heat-treated at the same time, was about 0.9%.

Figure 5B:
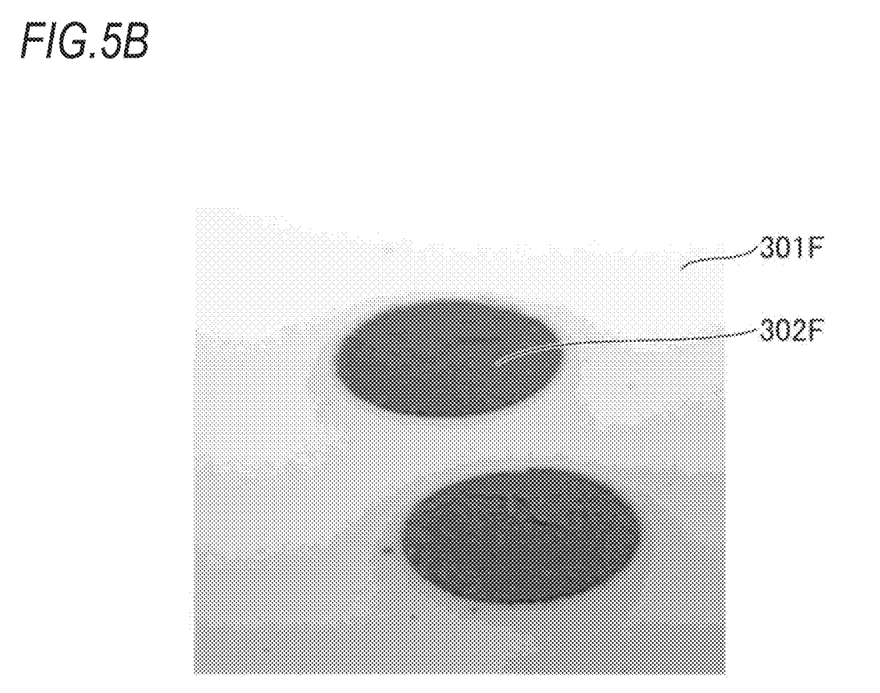

Next, as a result of firing the above degreased body at 1560° C. for 2 hours in a dry N2 atmosphere, as shown in FIG. 5B, a dense sintered body in which the ceramic part (indicated by 301F in the drawing) was completely white and the electrode (indicated by 302F in the drawing) was black-gray was obtained. Swelling of the electrode 302F and blurring of the peripheral edge portion were not observed, no fracture or peeling occurred even in the scratch test, and sufficient adhesion was obtained. In addition, the resistance value of the electrode 302F by the room temperature two-terminal method was about 20Ω, and conductivity sufficient to function as the electrostatic electrode 22 of the electrostatic chuck was confirmed.

Figure 6:
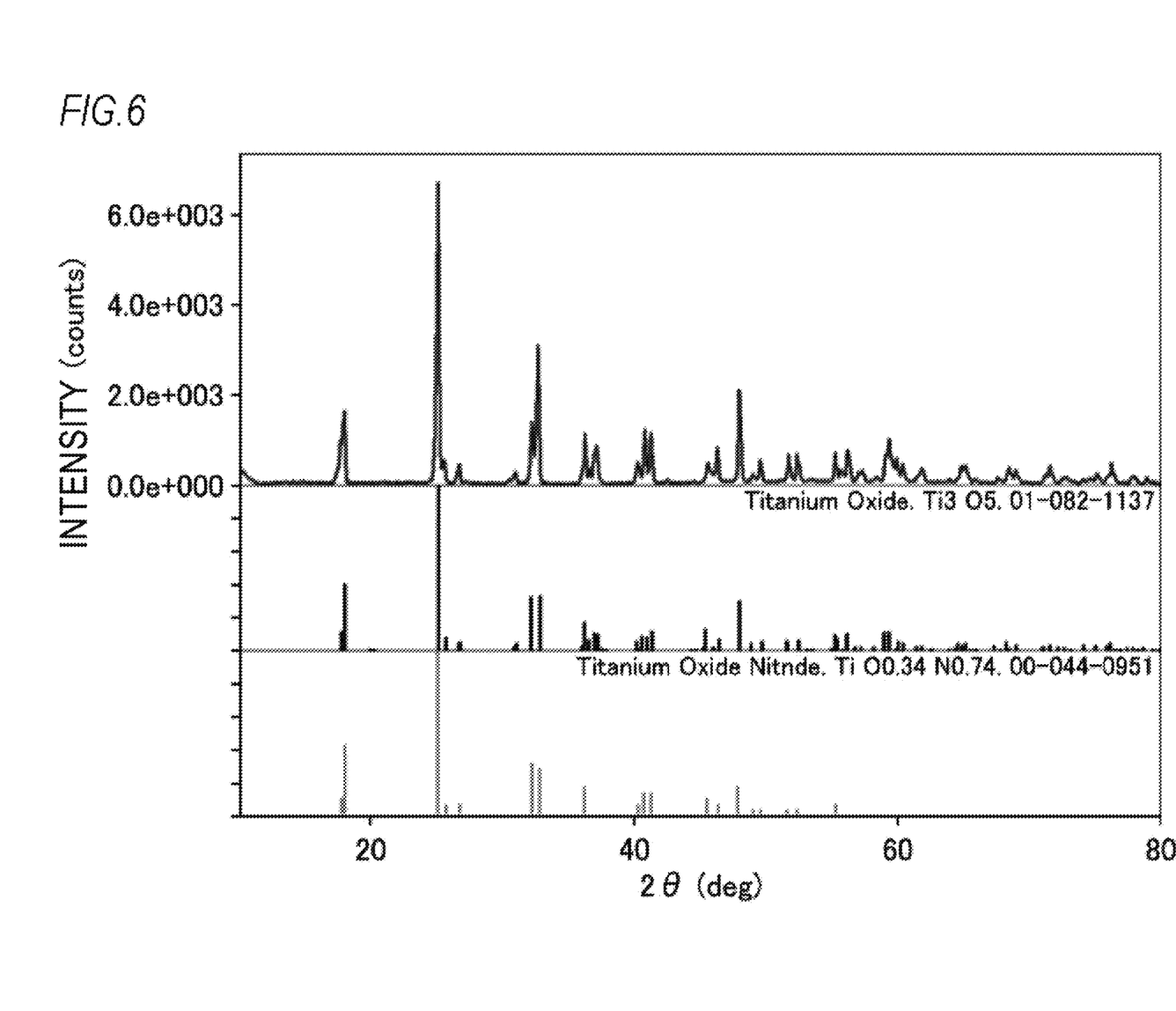
FIG. 6 shows an X-ray diffraction analysis result of an electrode of the test sample prepared in Example.

Next, an X-ray diffraction analysis was conducted on the electrode 302F. FIG. 6 is an X-ray diffraction analysis result of the electrode 302F of the test sample prepared in Example. In FIG. 6, the horizontal axis is the diffraction angle (2θ) of X-ray, and the vertical axis is the intensity of diffraction X-ray. As shown in FIG. 6, the diffraction pattern of $Ti_3O_5$ was confirmed. Note that $TiO_{0.34}N_{0.74}$, which is an oxynitride of titanium, also has the same diffraction pattern, but detection of trace nitrogen is limited, so the possibility of slight coexistence of such an oxynitride cannot be ruled out.

Considering the result of the X-ray diffraction analysis together with the measurement result by the room temperature two-terminal method described above, the resistance value of the electrode having $Ti_3O_5$ as a main component is about 20Ω, which shows conductivity sufficient to function as an electrostatic electrode. In addition, the atomic ratio of oxygen to Ti in $Ti_3O_5$ is about 1.7. Therefore, when atomic ratio y/x is less than 1.7 in $Ti_xO_y$, which is an oxide of titanium, a resistance value lower than $T_{13}O_5$ is obtained, and the electrode can be used as an electrostatic electrode.

Note that, in the above example, the electrode was formed on the surface layer for the purpose of confirming and analyzing the applied part of the paste for electrode formation, but there is no finding that it is problematic even if the electrode is formed in the laminate.

In addition, under high-temperature conditions at which carbon does not coexist, $TiO_2$ reacts with $Al_2O_3$ to produce $Al_2TiO_5$. However, under the conditions of carbon coexistence in this oxygen-free atmosphere (dry $N_2$), $TiO_2$ was not found to be a direct reactant with $Al_2O_3$. However, there is no finding that can rule out the possibility of generating a small amount of a reactant below the detection limit at the interface between the applied part of the paste for electrode formation and the ceramic.

In addition, $Al_2O_3$ itself is reductively nitrided to form AlN from about 1150° C. when only carbon and $N_2$ coexist without $TiO_2$, but it was not detected in this test sample.

Further, under these conditions, the $TiO_2$ phase was found to disappear at about 800° C.

Although the preferred embodiments and the like have been described in detail, the present invention is not limited to the above-described embodiments and the like, and a variety of changes and replacements can be made for the above-described embodiments and the like without departing from the scope defined in the claims.

For example, in the present embodiment, the heat-generating element 24 may be arranged between the electrostatic chuck 20 and the base plate 10. In addition, the heat-generating element 24 may be provided in the base plate 10. Further, the heat-generating element 24 may be externally mounted below the electrostatic chuck.

Further, the substrate fixing device according to present embodiment is applied to a semiconductor manufacturing apparatus, such as a dry etching apparatus (for example, a parallel flat plate type reactive ion etching (RIE) apparatus).

Further, examples of the target object to be adsorbed of the substrate fixing device of the present embodiment may include a glass substrate and the like that are used in a manufacturing process of a liquid crystal panel and the like, in addition to the semiconductor wafer (such as a silicon wafer).

What is claimed is:

1. An electrostatic chuck comprising:
a base body; and
an electrostatic electrode embedded in the base body,
wherein the base body is a ceramic,
wherein the electrostatic electrode has $Ti_xO_y$, which is an oxide of titanium, as a main component, and
wherein an atomic ratio y/x is less than 1.7.

2. The electrostatic chuck according to claim 1, wherein the electrostatic electrode is composed of only the oxide of titanium.

3. The electrostatic chuck according to claim 1, wherein the electrostatic electrode is composed of the oxide of titanium and an oxynitride of titanium.

4. The electrostatic chuck according to claim 1, wherein the oxide of titanium is $Ti_3O_5$.

5. An electrostatic chuck comprising:
a base body; and
an electrostatic electrode embedded in the base body,
wherein the base body is a ceramic, and
wherein the electrostatic electrode is composed of only an oxynitride of titanium.

6. The electrostatic chuck according to claim 5, wherein the oxynitride of titanium is $TiO_{0.34}N_{0.74}$.

7. The electrostatic chuck according to claim 1, wherein the base body is an aluminum oxide ceramic containing 10 mol % or more and 80 mol % or less of an yttrium aluminum garnet phase.

8. The electrostatic chuck according to claim 1, wherein the base body is an aluminum oxide ceramic having an aluminum oxide purity of 99 wt % or higher.

9. The electrostatic chuck according to claim 1, wherein the base body has an insulation resistivity of $10^{14}$ $\Omega$m or higher at 300° C.

10. A substrate fixing device comprising:
a base plate; and
the electrostatic chuck according to claim 1 mounted on one surface of the base plate.

11. A paste containing titanium dioxide powder and carbon powder and to be used for an electrostatic electrode of an electrostatic chuck,
wherein the paste contains the titanium dioxide powder and the carbon powder so that an amount of the carbon powder relative to an amount of the titanium dioxide powder is within a range of 1.8 or more and 2.2 or less in terms of a molar ratio.

* * * * *